Jan. 26, 1960 H. K. HENISCH 2,922,898
ELECTRONIC COUNTER
Filed March 27, 1956
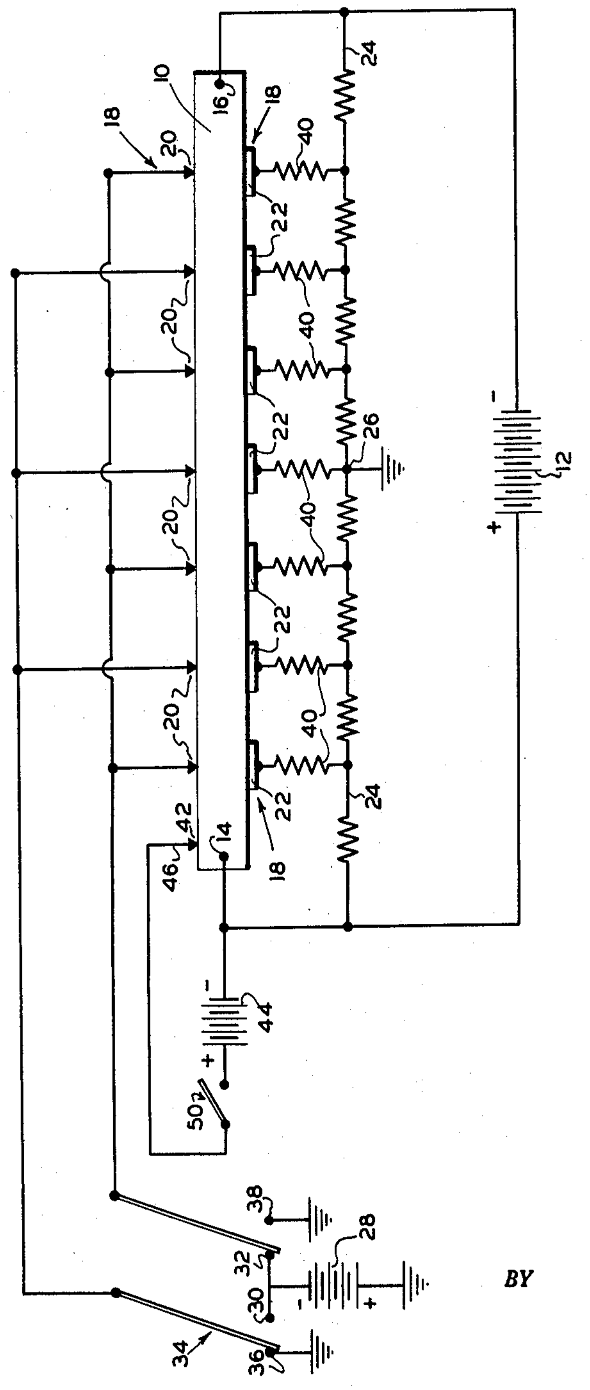
INVENTOR.
HEINZ K. HENISCH
BY
ATTORNEY United States Patent Office 2,922,898

Patented Jan. 26, 1960

2,922,898

ELECTRONIC COUNTER

Heinz K. Henisch, Flushing, N.Y., assignor, by mesne assignments, to Sylvania Electric Products Inc., Wilmington, Del., a corporation of Delaware Application March 27, 1956, Serial No. 574,202

3 Claims. (Cl. 307—88.5)

My invention is directed toward electronic counters or scalers and similar devices.

Many present day electronic systems adapted to process electrical signals in digital form make widespread use of counters or scalers, as, for example, in counting the number of electrical pulses contained in a pulse train or in counting the number of switching operations utilized in a given period. Conventionally such devices are formed from a plurality of discrete electrically interconnected counting elements, such as vacuum tubes or transistors.

I have invented a new type of counter or scaler which utilizes a single semiconductor element in place of the plurality of discrete elements and yet functions as if such a plurality were actually used.

Accordingly, it is an object of the invention to provide a new and improved counter or scaler of the character indicated.

Another object is to improve counters or scalers through the utilization of a single semiconductor element in place of the plurality of semiconductor or vacuum tube elements heretofore used.

Still another object is to provide a counter or scaler in which minority charge carriers are injected into a semiconductor element and thereafter under the influence of an applied electric field migrate or drift through a portion of the element in a predetermined direction.

Yet another object is to provide a new and improved counter or scaler characterized by the use of a single semiconductor element to which is secured a plurality of contact pairs spaced apart from each other.

Yet a further object is to eliminate the necessity of using a plurality of discrete vacuum tubes or transistor elements in a counter or scaler.

These and other objects of my invention will either be explained or will become apparent hereinafter.

One type of semiconductor diode known to the art as an injecting base diode comprises a semiconductor element or die of the N or P type connected between a point contact (which serves as a collector) and an injecting base contact (which serves as an emitter).

The point contact has an inherently high resistance while the base contact has an inherently low resistance. The resistance of the element in a region adjacent the point contact known as the spreading resistance is relatively high while the resistance of the element in a region adjacent the base contact is relatively low. Therefore, when this diode is biased in its backward direction, the point contact and its associated element region defines an area of high potential difference (high field), while the base contact and its associated element region defines an area of low potential difference (low field). Consequently, minority carriers injected by the base contact must traverse the low field region in which they travel slowly before reaching the high field region. As a result very few carriers survive to reach the high field region and fewer still to reach the collector. The base injection process is thus ineffective and the diode is essentially non-conductive, as it would be if the base were non-injecting. However, when minority charge carriers are injected into the element at an auxiliary point separated from both contacts and subjected to the influence of an externally applied electric field in such manner that some of these injected carriers enter the region of the semiconductor element adjacent the point contact, both the spreading resistance and the contact resistance are decreased. If the bias voltage remains constant, the potential difference across the contact and its spreading region is reduced and the field in the neighborhood of the base contact is thereby increased. These changes in the internal potential distribution permit a larger number of the carriers produced at the emitter to travel to the collector; as the number of these emitted carriers increases, the spreading and contact resistances are further decreased and the above described changes in the internal potential distribution are further accentuated.

As a result, the number of emitted carriers travelling to the collector increases very rapidly, and the diode becomes heavily conductive. When this state is reached, the carriers injected by the auxiliary point have little or no effect upon the diode. The diode will remain heavily conductive even though the externally applied electric field is removed. Since the back biased diode is non-conductive yet is rendered conductive by the charge carriers, the applied bias serves to condition the diode for conduction.

In order to return the diode to its non-conductive state, the point and base contacts must be interconnected through an external low impedance as for example by short circuiting the two contacts, or the bias voltage should be removed as for example by open circuiting the two contacts.

Further, by securing a plurality of spaced point contacts to an elongated semiconductor element at discrete points intermediate the ends of the element and by securing a like plurality of spaced injecting base contacts to the element at other discrete points intermediate the ends of the element, I am able to produce an integral structure containing a like plurality of injecting base diodes.

I am able to utilize this structure as a counter in the following manner.

A device coupled to all the diodes has first and second mutually exclusive states. When the device is in its first state, the odd numbered diodes are rendered non-conductive by interconnecting the corresponding point and base contacts of the odd numbered diodes through an external low impedance path as, for example, by short-circuiting or open circuiting the contacts, while the even numbered diodes are conditioned for conduction. When the device is in its second state, the odd numbered diodes are conditioned for conduction, while the even numbered diodes are rendered non-conductive.

Minority charge carriers are injected into the element at a selected auxiliary point, for example, at a point adjacent the end of the element adjacent the first diode in said plurality of diodes. The injected carriers, under the influence of an externally applied electric field (produced between the ends of the element) are caused to drift through the element toward the other end of the element.

When the device is in its second state, the injected carriers pass through the region of the element adjacent the point contact of the first diode and render the first diode conductive. The second diode cannot be rendered conductive because of the action of the device. Further under the conditions indicated, most of the injected carriers are either collected in the first diode or recombine with oppositely charged carriers and disappear before arriving at the third diode, so that the number of injected carriers arriving at the third diode is insufficient to render the third diode conductive.

However, if the carrier injection process continues, and the device is placed in its first state, the first diode will not be rendered conductive; instead, the carriers will pass between the contacts of the first diode and upon arrival in the region of the element adjacent the point contact of the second diode will render the second diode conductive.

Thus, by changing the electrical state of the device at spaced intervals, each diode can be rendered alternatively conductive and non-conductive in sequence, and the entire arrangement can be used to count the number of state changing operations to which the device is subjected.

An illustrative embodiment of my invention will now be described with reference to the accompanying figure which shows my invention in schematic form.

Referring now in particular to the figure, there is provided an elongated semiconductor element 10 which can be formed, for example, from germanium or silicon of the N or P types. In this example, the element is formed from N type germanium. A battery 12 having the polarity indicated is connected between opposite ends 14 and 16 of element 10. The field so established has an intensity and a polarity or direction at which, when minority charge carriers are injected into element 10 at some particular point, a portion of these carriers will migrate through the element toward end 16. (By reversing the direction of the field, the direction of migration will be reversed.)

Secured to element 10 in spaced apart relation are a plurality of contact pairs 18, each pair comprising a point contact 20 and an oppositely disposed injecting base contact 22. Each pair together with the portion of the element included between the contacts forming the pair constitutes an injecting base diode.

A voltage divider network 24 is connected across battery 12 and is grounded at its midpoint 26. Each base contact 22 is connected through a base contact resistor 40 to a separate terminal on the voltage divider network. (This arrangement prevents short-circuiting of the battery 12.) A second battery 28 grounded at its positive terminal is connected at its negative terminal to terminals 30 and 32 of a double pole-double throw switch 34. The other two terminals of the switch, terminals 36 and 38, are grounded.

When the switch is in the position shown, the point contacts of the even numbered diodes are grounded (and hence the even numbered diodes are rendered non-conductive), whereas the contacts of the odd numbered diodes are connected to the negative terminals of the second battery (and hence these odd numbered diodes are back biased) and are conditioned for conduction. When the switch position is reversed, the even numbered diodes are conditioned for conduction, while the odd numbered diodes are rendered non-conductive.

Minority charge carriers are injected into element 10 at an auxiliary point 42 adjacent the end 14 of element 10. This injection can take place by utilizing incident light radiation, but in this example is accomplished by electrical injection through an auxiliary carrier injection electrode 46 connected to point 42 and also connected through a switch 50 and a third battery 44 to end 14 of the element 10. When switch 50 is closed, carriers are injected into the element 10 by electrode 46. When switch 50 is open (its normal position), no carriers are injected through electrode 46.

When switch 50 is closed and switch 34 is in the position shown, the first diode (i.e. the diode adjacent electrode 46) is rendered conductive in the manner indicated. No other diodes conduct.

When the position of switch 34 is reversed (switch 50 remaining closed), the second diode will be rendered conductive and all other diodes will be non-conductive.

Thus, each time the position of switch 34 is reversed, a different diode will be rendered conductive, and any number of switch reversed operations can be counted by using a suitable number of diodes utilizing a common integral semiconductor element.

While I have shown and pointed out my invention as applied above, it will be apparent to those skilled in the art that many modifications can be made within the scope and sphere of my invention as defined in the claims which follow.

What is claimed is:

1. A counter comprising an elongated semiconductor element; a plurality of contact pairs spaced apart from each other and secured to said element at positions intermediate the ends of said element, the contacts in each pair being oppositely disposed about said element, each pair together with the portion of said element contained between the contacts forming said each pair constituting a semiconductor diode; a switching and biasing device coupled to said diodes and having two mutually exclusive electric states, said device, when in one state, conditioning the odd numbered diodes for conduction while maintaining the even numbered diodes non-conductive, said device, when in the other state, conditioning the even numbered diodes for conduction while maintaining the odd numbered diodes non-conductive.

2. A counter comprising an elongated semiconductor element; a plurality of contact pairs spaced apart from each other and secured to said element at positions intermediate the ends of said element, the contacts in each pair being oppositely disposed about said element, each pair together with the portion of said element contained between the contacts forming said each pair constituting a semiconductor injecting base diode; a switching and biasing device coupled to said diodes and having two mutually exclusive electric states, said device, when in one state conditioning the odd numbered diodes for conduction while maintaining the even numbered diodes non-conductive, said device when in the other state conditioning the even numbered diodes for conduction while maintaining the odd numbered diodes non-conductive, said device changing from one state to another at spaced intervals; means to inject minority charge carriers into said element at a selected point intermediate the ends thereof; means coupled between the ends of said element to establish an electric field therebetween acting upon said carriers to cause certain of said carriers to migrate through said element from said point toward a selected one of said ends, whereby said carrier portion successively passes through each diode in the group of diodes positioned between said point and said one end, each of the conditioned diodes in said group being rendered conductive at the instant at which said carrier portion passes therethrough.

3. A counter comprising a plurality of semi-conductor injecting base diodes, each being formed from a semiconductor element sandwiched between a pair of contacts, the elements of all said diodes forming a single integral elongated semiconductor member; a device having first and second mutually exclusive states and coupled to said diodes, said device, when in said first state, conditioning the odd numbered diodes for conduction while maintaining the even numbered diodes non-conductive and, when in said second state, reversing the diode relations established by said first state; means to inject minority charge carriers into said member; means coupled to said member to cause certain of said carriers to migrate through said member and successively pass through the element portion of each of said diodes, each diode conditioned for conduction being rendered conductive at the instant said carriers pass therethrough; and means coupled to said device to change the state thereof at a rate at which only one diode can be conductive at any one instant.

References Cited in the file of this patent

UNITED STATES PATENTS

| | | |
|---|---|---|
| 2,586,080 | Pfann | Feb. 19, 1952 |
| 2,595,497 | Webster | May 6, 1952 |
| 2,608,674 | Depp | Aug. 26, 1952 |
| 2,655,607 | Reeves | Oct. 13, 1953 |
| 2,770,740 | Reeves et al. | Nov. 13, 1956 |
| 2,832,898 | Camp | Apr. 29, 1958 |
| 2,877,358 | Ross | Mar. 10, 1958 |